WAFER CONSTRUCTION FOR A SWITCH TUNER

Filed March 14, 1968 2 Sheets-Sheet 1

INVENTORS:
EUGENE K. VON FANGE,
SANJAR GHAEM-MAGHAMI

BY [signature]
THEIR ATTORNEY.

WAFER CONSTRUCTION FOR A SWITCH TUNER

Filed March 14, 1968 2 Sheets-Sheet 2

INVENTORS:
EUGENE K. VON FANGE,
SANJAR GHAEM-MAGHAMI,

BY Francis H. Boos, Jr.
THEIR ATTORNEY.

United States Patent Office 3,536,877

Patented Oct. 27, 1970

3,536,877

WAFER CONSTRUCTION FOR A SWITCH TUNER

Eugene K. Vonfange and Sanjar Ghaem-maghami, Chesapeake, Va., assignors to General Electric Company, a corporation of New York Filed Mar. 14, 1968, Ser. No. 713,234
Int. Cl. H01h *1/06*
U.S. Cl. 200—166 10 Claims

ABSTRACT OF THE DISCLOSURE

A copper coating overlays a planar dielectric member to form a wafer for a switch tuner. The copper coating forms a plurality of planar conductive elements having characteristic inductances at high frequencies and all lying outside but connected to a circular contact area including contact elements compromising silver plate or resilient contact elements. The planar conductive elements are arranged in a manner so as to intersect a line drawn tangent to the circular contact area.

BACKGROUND OF THE INVENTION

This invention relates to a switch tuner, and more specifically it relates to a wafer construction for a switch tuner.

As commonly found in the art, the switch tuner comprises one or more stators or wafers supporting planar conductive patterns and further comprises one or more corresponding rotors or rotatable switch members for alternately connecting the planar conductive elements. Since each of the planar conductive elements possesses a characteristic inductance, which may be visualized as a conventional coil at high frequencies, the connection of these elements in various combinations will produce a variable or tunable inductance.

In the tuner industry, the switch tuner has long provided an inductively tuned alternative for the turret tuner, particularly in VHF tuners for television receivers. Yet, manufacturers of television receivers have generally preferred the turret tune, a preference which is no doubt attributable to the somewhat superior performance of the turret tuner. Surprisingly enough, this performance exists in spite of the somewhat lower cost of the switch tuner.

It is believed that the reasons for this preference are at least in part explained by certain deficiencies in the prior art wafer construction. In one prior art construction, the wafer was preformed apart from and later applied to its supporting dielectric member. While certain wafers of this particular construction were of sound design in that they provided planar conductive elements lying outside a circular contact area thereby allowing connection of discrete electronic components at the edges of the wafer, they were expensive to build. The expense resulted from the necessity of fastening the planar conductive elements to the dielectric member in an additional time-consuming, manufacturing step.

In another prior art construction, the wafers were formed by conventional printed circuit board manufacturing techniques with planar conductive elements positioned within the outermost circular contact area. While this construction eleminated the additional manufacturing step of fastening the planar conductive elements to the dielectric member, the long and narrow conductive elements necessitated by the confines of the circular contact area led to inaccuracies in the conductive elements which significantly affected the inductance. The inaccuracy resulted from the fact that the overall inductance of a long conductive segment of very narrow width was extremely sensitive to slight changes in that width. And, since the requisite narrow width was difficult to achieve with the cost saving etching procedures of printed circuit manufacturing techniques, the wafer seldom measured up to expectations. In addition, the close proximity between conductive elements within the confines of the circular contact area led to unwanted mutual coupling. Furthermore, the confinement of the conductive elements prohibited connection at the edge of the wafer to a printed circuit board carrying electronic components. As a result, coupling to additional electronic circuitry including additional discrete tuning inductors was undesirably restricted.

Finally, both of the previously described prior art constructions have been expensive from a materials standpoint. The major contributing expense has been the usage of silver for the conductive elements as well as the contact areas.

In conclusion, the prior art wafer constructions have rendered switch tuner performance inferior without a compensatory cost saving.

SUMMARY OF THE INVENTION

Therefore and in view of the foregoing conclusion, it is a first object of this invention to achieve a wafer which is inexpensive to manufacture.

It is a further object of this invention to achieve a wafer construction which is substantially insensitive to the inaccuracies of a low cost manufacturing technique.

And, it is a still further object of this invention to achieve a wafer construction which is readily connected to separate electronic components such as might be carried on a printed circuit board.

In certain embodiments of the invention, consistent with the above objectives, there is provided a switch tuner wafer comprising a dielectric member, an outermost substantially arcuate contact area including contact elements, and a plurality of conductive elements forming a plurality of conductive paths. The planar conductive elements at least one of which lies outside the locus of radii of the arcuate contact area, coat the dielectric member to form a continuum therewith.

BRIEF DESCRIPTION OF THE DRAWING

This specification concludes with claims particularly pointing out and distinctly claiming the subject matter which is regarded as the invention. The invention may also be understood from the following description taken in connection with the accompanying drawings in which:

DESCRIPTION OF THE PREFERRED EMBODIMENTS

Figures 1, 3:
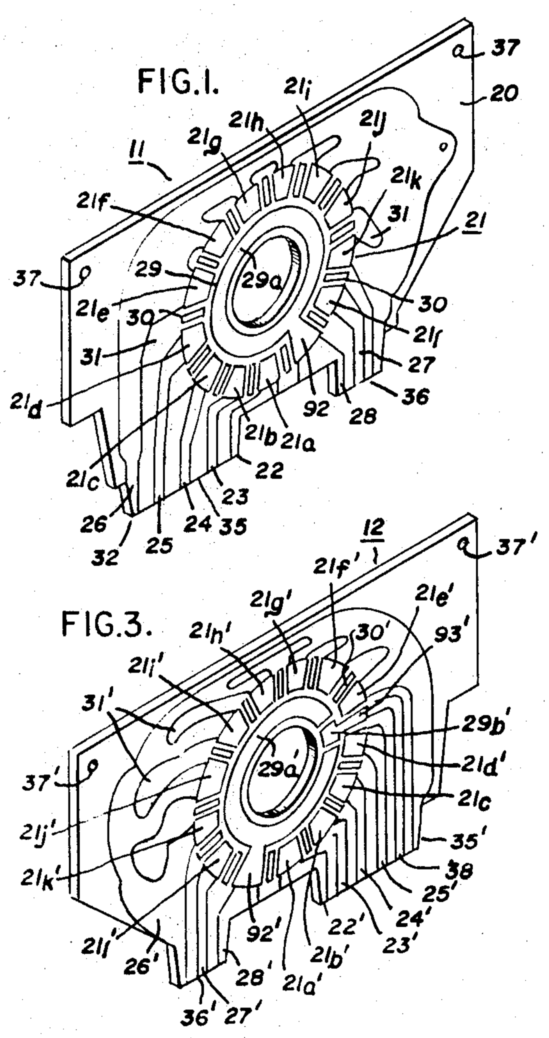
FIG. 1 is a perspective view of the conductive side of a wafer.
FIG. 3 is a perspective view of a wafer with a modified conductive pattern.
Figure 2:
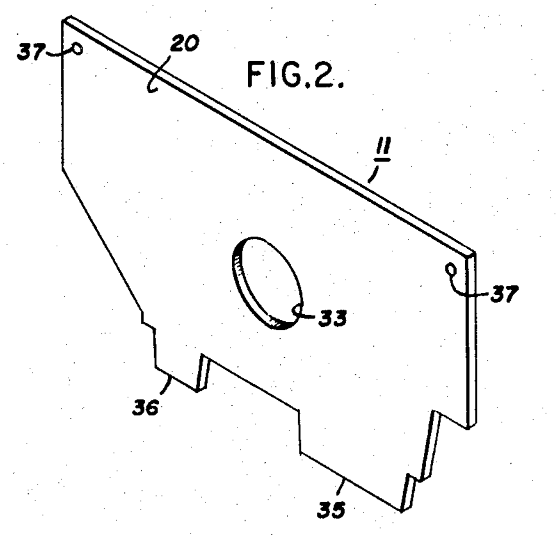
FIG. 2 is a perspective view of the non-conductive side of a wafer.

In the embodiment shown in FIGS. 1 and 2, a wafer 11 comprises a dielectric member 20 carrying an outermost arcuate or circular contact area 21 including silver plated contact elements 21*a–l*. The plurality of contact elements 21*a–l* are connected to copper planar conductive elements 22–27 at one or more points. The wafer further comprises a second arcuate or circular contact area 29 comprising a single silver plate contact element 29*a* connected to a copper planar conductive element 28 by an interconnecting silver plated connecting segment 92. The wafer may be tuned by serially connecting element 28 to elements 22–27 in various combinations through variably electrically connecting the contact elements 21*a–l* and 29*a*.

In order to facilitate connection to various electronic circuitry including discrete supplemental inductors, the planar conductive elements 22–28 are all positioned outside the circular contact area 21. Since the conductive elements radiate toward the edges of the dielectric member 20, electronic components may be connected to the elements 22–28 by expedients such as printed circuit boards.

Figure 5:
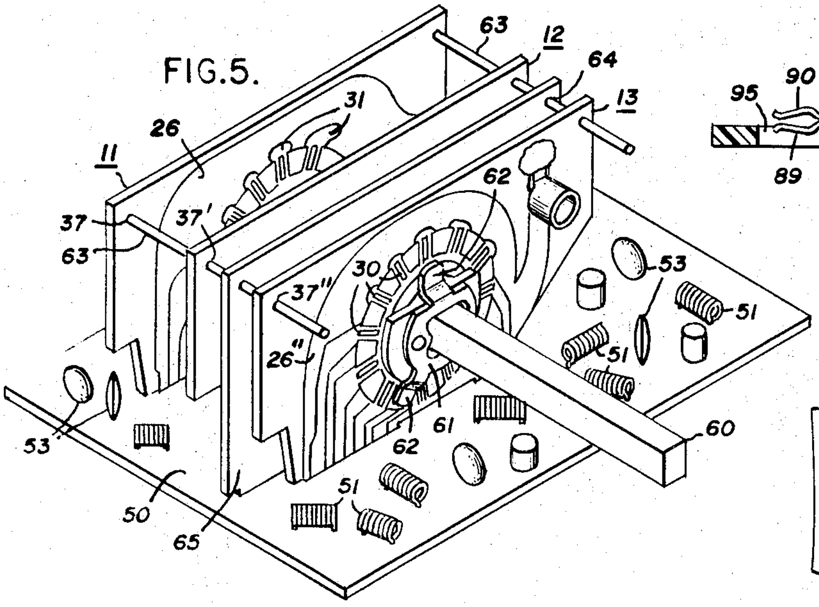
FIG. 5 is a perspective view above a switch tuner assembly comprising a plurality of wafers.
Figure 9:
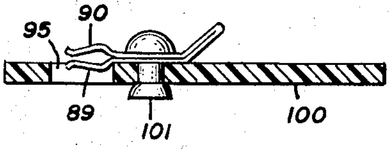
FIG. 9 is a sectional view of the wafer as taken along section line 1—1 of FIG. 7.
Figure 10:
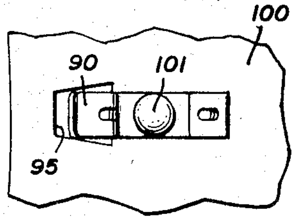
FIG. 10 is an enlarged view of a contact element on the wafer of FIG. 7.
Figures 6, 7:
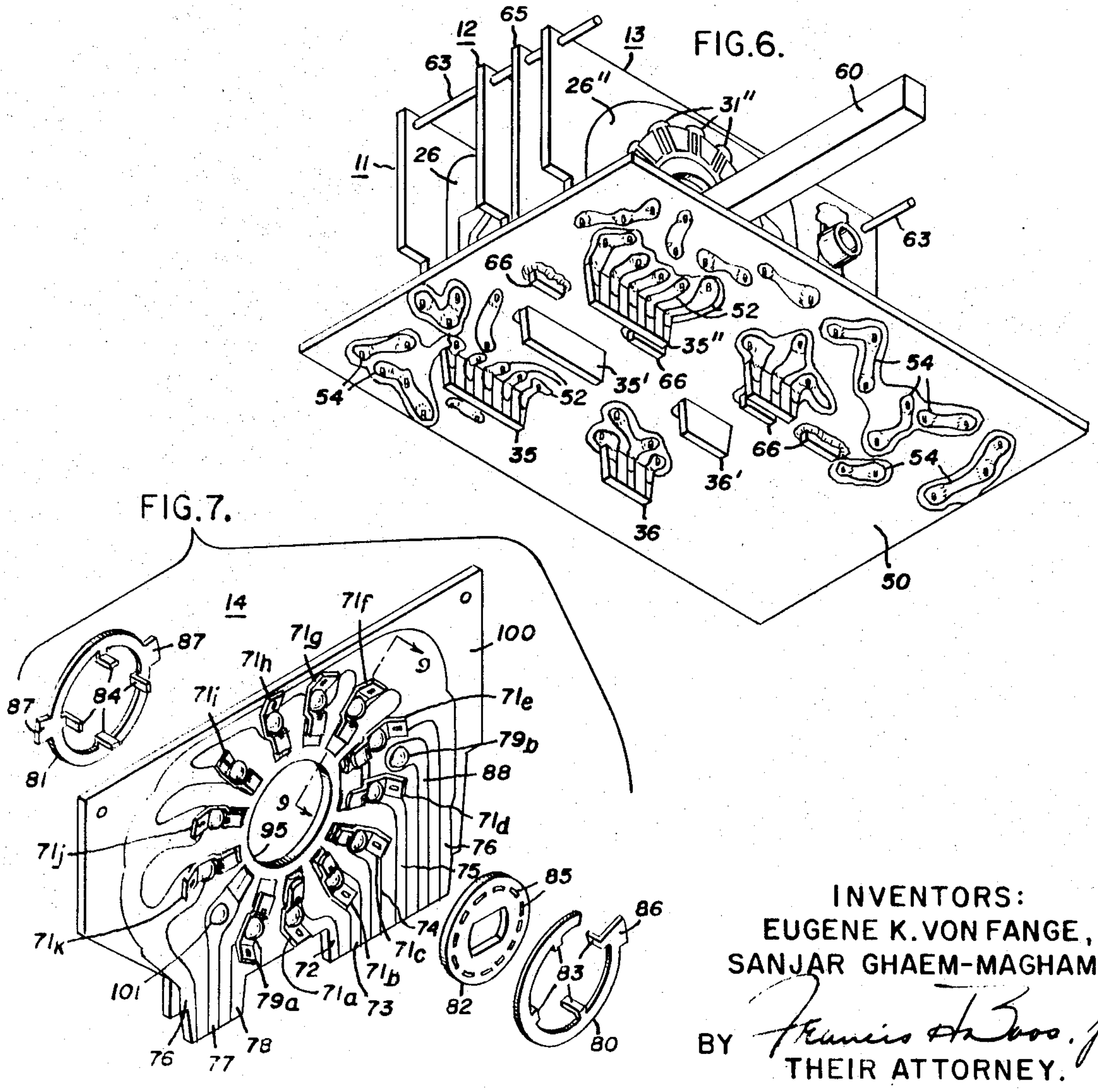
FIG. 6 is a perspective view below the switch tuner assembly of FIG. 5.
FIG. 7 is an exploded perspective view of a wafer displaying an alternative embodiment of the invention including resilient contact elements.

In particular, the intersection of the elements 22–28 with an imaginary line drawn tangent to the circular contact area 21 and parallel to dielectric member edge 32 permits electrical connection of all the elements 22–28 to a single printed circuit board as shown in FIGS. 5 and 6. In addition, the positioning of the elements 22–28 outside the contact area 21 allows sufficient mutual separation by insulative voids 31 to achieve mutual isolation.

Furthermore, the positioning of the elements 22–28 outside the contact area 21 eliminates the need for conductive elements of narrow widths. As a result, the tolerances in widths of the conductive elements 22–28 are sufficiently loose to permit etching by cost-saving, conventional printed circuit board techniques. This means that the conductive elements 22–28 may be applied to the dielectric member 20 at the time of formation thereby eliminating the expense of a separate manufacturing step of applying the elements 22–28 to the dielectric member 20.

Since it is desirable to maintain the rotor contacts substantially free from contamination by the dielectric member 20, it becomes necessary to maintain a nearly continuous silver surface in the contact area 21 so as to avoid rotor contact with the dielectric member 20. However, placement of the individual contact elements 21*a–l* in mutually close proximity will result in undesirable mutual coupling. In order to avoid this mutual coupling, the contact elements 21*a–l* and 29*a* are separated by silver bridge segments 30 which serve as isolating islands in the insulative voids 31.

Finally, the wafer 11 includes a number of mechanical features which adapt it for an assembly mounting. These features include a central aperture 33 which will receive a rotor shaft, a pair of legs 35 and 36 which may be inserted in a printed circuit board, and a pair of apertures 37 which receive assembly mounting rods for securing the wafer 11 in place.

Figure 4:
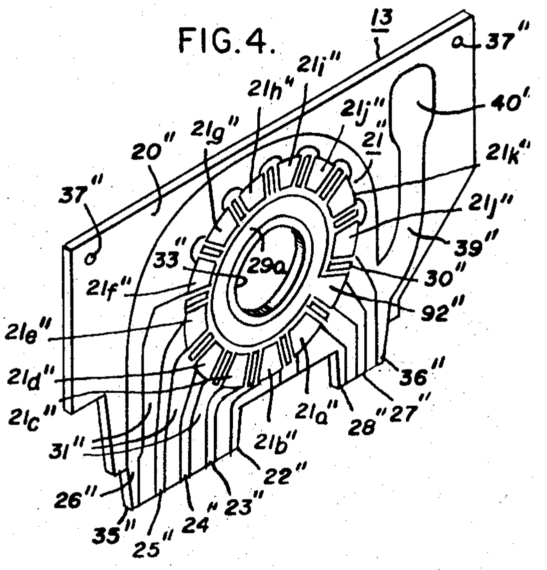
FIG. 4 is a perspective view of a wafer with a still further modified conductive pattern.
Figure 8:
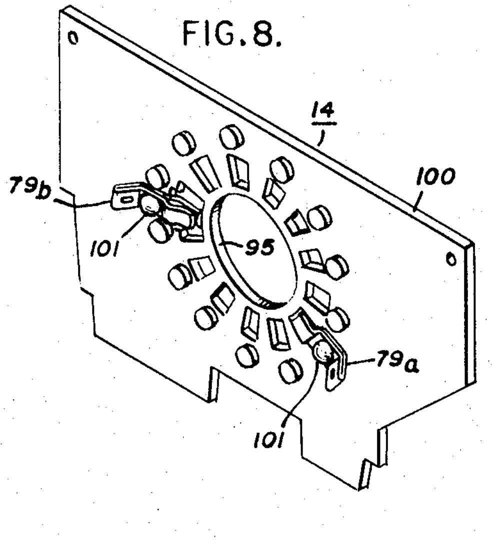
FIG. 8 is a perspective view of the reverse side of the wafer of FIG. 7.

A wafer 12 which is, for impedance matching purposes, substantially a mirror image of the wafer 11 is shown in FIG. 3. Although the wafer 12 may provide a somewhat different tuning function due to the addition of a contact element 29*b'* which is connected to a planar conductive element 38' through silver plated segment 93', it is substantially similar to the wafer 11. Consequently, the elements of the wafer 12 are shown with element numbers corresponding to the element number of the wafer 11 primed. Similarly, the wafer 13 which is capable of yet another tuning function is shown in FIG. 4 with element numbers corresponding to the element numbers of the wafer 11 double primed. The wafer 13 also includes a planar conductive element 39'' which may be connected to external circuitry, such as fine tuning means, at contact point 40''.

In order to demonstrate the ease of connecting a wafer of this novel construction to a printed circuit board, a tuner assembly is shown in FIGS. 5 and 6. In those figures, it may be seen that a printed circuit board 50 lying a plane defined by parallel lines intersecting each of the elements 22–28, 22'–28' and 22''–28'' of the wafers 11, 12 and 13 respectively may easily couple a number of electronic components to each wafer. In particular, a plurality of inductors 51 may be individually coupled between elements 22''–27'' at solder points 52 on legs 35'' and 36'' to provide additional inductance for tuning purposes. Similarly, additional inductors not shown may be connected to elements 22–26 and 28 as well as 22'–26' and 28' on legs 35–36 and 35'–36' respectively. Furthermore, the circuits to be tuned including components 53 may also be readily connected to the wafers 11–13 by printed circuitry 54.

In order to retain the assembly in one piece, the legs 35, 36, 35', 36', 35'', and 36'' are inserted through apertures in the circuit board 50. Additional support is provided by inserting rods 63 through the apertures 37, 37', and 37''. The rods 63 also pass through apertures 64 in a conductive shield 65 which is positioned between the wafers 12 and 13. Further support for the shield 65 is achieved by inserting tabs 66 through apertures in the board 50 and soldering the tabs in place.

The actual tuning of the assembly is effected by rotation of a shaft 60 carrying a rotor contact member 61 for each wafer 11–13. The contact member 61 includes two contact portions 62 which serve to couple the inner circular contact area 29 to the outer circular contact area 21 thereby variably connecting the planar conductive elements coating each wafer.

Actually, the contact areas 21 and 29 need not comprise silver plated contact elements. In fact, the contact areas 21 and 29 may comprise resilient contact elements 71*a–l* and 79*a* and *b* secured by conductive rivets 101 to form the wafer 14 as shown in FIGS. 7–10. The wafer 14 which is for all practical purposes a one for one equivalent with the wafer 12 combines the cost saving feature of coated conductive elements 72–78 and 88 with a further cost saving in the non-silver plated contact elements 71*a–l* and 79*a* and *b*. In achieving this end, the wafer 14 differs somewhat structurally from the wafer 12 in that the contact element 79*b* is positioned on the nonconductive side of the wafer as is the contact element 71*l*.

A further difference between the wafer 12 and the wafer 14 lies in the fact that the contact area 79 is not arcuate or circular. Instead, circular contact elements 80 and 81 are utilized. The contact elements 80 and 81 which include studs 83 and 84 are mounted on a dielectric member 82 with the studs 80 and 81 clinched after insertion through apertures 85. After the entire contact structure is inserted in aperture 95 of the wafer 14, the contact elements 80 and 81 including flanges 86 and 87 may be rotated to variably contact each of the contact elements 71*a–l* and 79*a* and *b*. As the contact elements 80 and 81 rotate, they pass between spreading blades 89 and 90 of each contact element. Because each contact element is positioned over an aperture 95, the blade 89 may be freely deflected without undue restriction by the dielectric member 100.

In the foregoing, the description has been directed to wafers particularly adapted for use in VHF tuners for television receivers. This has been done since it is believed that a low cost tuner which renders a good performance is particularly suitable to today's television market. However, the tuner is equally useful in any market wherein a good tuner at reduced cost is required.

Although specific embodiments of the invention have been shown, it is not desired that the invention be limited to any particular form shown, and it is intended by the appended claims to cover all modifications within the spirit and scope of the invention.

What is claimed as new and desired to be seuced by Letters Patent of the United States is:

1. A switch tuner wafer comprising:
a dielectric member;
a substantially arcuate contact area secured to said dielectric member, said arcuate contact area having a radius greater than the radius of any other arcuate contact area secured to said dielectric member; and
a plurality of planar conductive elements forming a forming a plurality of conductive paths and having characteristic inductances at high frequencies, said planar conductive elements coating said member to form a continum therewith and being electrically connected to said arcuate contact area, all of said planar conductive elements lying outside the locus of radii of said arcuate contact area.

2. The wafer as recited in claim 1 wherein more than one of said planar conductive elements would intersect a line drawn tangent to said arcuate contact area.

3. The wafer as recited in claim 1 wherein said arcuate contact area comprises a plurality of mutually insulated contact elements individually connected to said planar conductive elements, one of said planar conductive elements connected to more than one of said contact elements.

4. The wafer as recited in claim 1 wherein said arcuate contact area comprises a plurality of mutually insulated contact elements individually connected to said planar conductive elements, at least one of said planar conductive elements being connected to only one of said contact elements.

5. The wafer as recited in claim 1 wherein said planar conductive elements comprise a copper laminate.

6. The wafer as recited in claim 1 including contact area positioned inside the locus of radii of said arcuate contact area.

7. The wafer as recited in claim 6 wherein said arcuate contact area comprises a plurality of contact elements and said other contact area comprises at least one other element, said plurality of contact elements and said other contact element comprising silver plate.

8. A switch tuner wafer comprising:
a dielectric member;
a substantially circular contact area of a first radius secured to said dielectric member, said circular contact area comprising a plurality of contact elements;
a second contact area positioned within said first contact area and comprising at least one contact element;
and a plurality of planar conductive elements coating said dielectric member to form a continuum therewith and having characteristic inductances at high frequencies, said planar conductive elements all lying outside of and radiating away from said circular contact area such that more than one of said conductive elements would intersect a line drawn tangent to said circular contact area, a first of said conductive elements being electrically connected to more than one of said plurality of contact elements, a second of said conductive elements being electrically connected to only one of said plurality of contact elements, and a third of said conductive elements being electrically connected to said at least one contact element.

9. The switch tuner wafer as recited in claim 8 wherein said planar conductive elements are copper.

10. The switch tuner wafer as recited in claim 9 wherein said plurality of contact element and said at least one contact element comprise silver plate.

References Cited

UNITED STATES PATENTS

| | | |
|---|---|---|
| 2,910,628 | 10/1959 | Keener. |
| 3,089,923 | 5/1963 | Wright. |
| 3,257,537 | 6/1966 | Clark. |
| 3,268,674 | 8/1966 | Golbeck et al. |
| 3,293,399 | 12/1966 | Heinrich. |
| 3,440,640 | 4/1969 | Droniou et al. |

H. O. JONES, Primary Examiner

U.S. Cl. X.R.

336—200